(12) United States Patent
Chou et al.

(10) Patent No.: US 11,990,202 B2
(45) Date of Patent: May 21, 2024

(54) DATA RECOVERY METHOD FOR MEMORY DEVICE

(71) Applicant: MACRONIX INTERNATIONAL CO., LTD., Hsinchu (TW)

(72) Inventors: You-Liang Chou, Taichung (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 2 days.

(21) Appl. No.: 18/047,661

(22) Filed: Oct. 19, 2022

(65) Prior Publication Data
US 2024/0136009 A1 Apr. 25, 2024

(51) Int. Cl.
*G11C 29/52* (2006.01)
*G11C 11/56* (2006.01)
*G11C 16/04* (2006.01)
*G11C 16/08* (2006.01)
*G11C 16/10* (2006.01)
*H10B 43/35* (2023.01)

(52) U.S. Cl.
CPC .......... *G11C 29/52* (2013.01); *G11C 11/5671* (2013.01); *G11C 16/08* (2013.01); *G11C 16/10* (2013.01); *G11C 16/0483* (2013.01); *H10B 43/35* (2023.02)

(58) Field of Classification Search
None
See application file for complete search history.

(56) References Cited

U.S. PATENT DOCUMENTS

| | | | |
|---|---|---|---|
| 9,275,736 B2 | 3/2016 | Mun et al. | |
| 10,424,383 B1* | 9/2019 | Hsiao | G06F 3/0659 |
| 10,937,503 B2 | 3/2021 | Lee et al. | |
| 2003/0147286 A1 | 8/2003 | Tanaka et al. | |
| 2007/0153583 A1* | 7/2007 | Guterman | G11C 16/3427 |
| | | | 365/185.23 |
| 2008/0013379 A1* | 1/2008 | Lin | G11C 16/24 |
| | | | 365/208 |
| 2012/0127801 A1* | 5/2012 | Kim | G11C 11/5628 |
| | | | 365/185.24 |

(Continued)

FOREIGN PATENT DOCUMENTS

| | | |
|---|---|---|
| CN | 104851459 B | 8/2019 |
| CN | 112102872 A | 12/2020 |

OTHER PUBLICATIONS

R. -A. Cernea et al., "A 34 MB/s MLC Write Throughput 16 GB NAND With All Bit Line Architecture on 56 nm Technology," in IEEE Journal of Solid-State Circuits, vol. 44, No. 1, pp. 186-194, Jan. 2009, doi: 10.1109/JSSC.2008.2007152. (Year: 2009).*

*Primary Examiner* — Daniel F. McMahon
(74) *Attorney, Agent, or Firm* — McClure, Qualey & Rodack, LLP

(57) ABSTRACT

A data recovery method is applied to a memory device which has a target memory cell, a target word line and an adjacent word line adjacent to the target word line. The target word line is connected to a gate of the target memory cell. The adjacent word line is connected to a gate of an adjacent memory cell, and the adjacent memory cell is adjacent to the target memory cell. In the data recovery method, a first program voltage is applied to the target memory cell through the target word line, and a second program voltage is concurrently applied to the adjacent memory cell through the adjacent word line.

10 Claims, 13 Drawing Sheets

(56) References Cited

U.S. PATENT DOCUMENTS

| | | | |
|---|---|---|---|
| 2014/0075259 A1* | 3/2014 | Tam | G06F 11/1044 |
| | | | 714/E11.053 |
| 2015/0046770 A1* | 2/2015 | Luo | G06F 11/1402 |
| | | | 714/764 |
| 2016/0343446 A1* | 11/2016 | Tanzawa | G11C 16/08 |
| 2017/0221570 A1* | 8/2017 | Hong | G11C 16/26 |
| 2021/0020254 A1* | 1/2021 | Kim | G11C 16/26 |
| 2023/0142279 A1* | 5/2023 | Park | G11C 16/102 |
| | | | 365/189.011 |

* cited by examiner

DATA RECOVERY METHOD FOR MEMORY DEVICE

TECHNICAL FIELD

The present disclosure relates to an operating method of a semiconductor device, and more particularly, to a data recovery method for dealing with data retention errors in a memory device.

BACKGROUND

When desired data is to be stored in a memory device, program voltages are applied to memory cells so that the memory cells may accumulate electrons, and the threshold voltage $V_t$ of the memory cells are adjusted accordingly, hence the threshold voltage $V_t$ reaches a desired threshold voltage state. Different threshold voltage states correspond to different content of data. Taking a triple level memory cell (TLC) as an example, the memory cell stores three bits of data, and the memory cell has eight threshold voltage states.

FIG. 1 is a schematic diagram illustrating a change of threshold voltage distribution of the memory cells and corresponding memory cells amounts when data retention errors occur and after data recovery is performed. As shown in FIG. 1, among the eight threshold voltage states of the TLC, the seventh state P7 corresponds to, for example, data (1, 1, 1), the sixth state P6 corresponds to data (1, 1, 0), and the fifth state P5 corresponds to data (1, 0, 1).

However, when electrons accumulated in the memory cell are lost, decrease of the number of electrons will cause the threshold voltage $V_t$ of the memory cell to decrease. In FIG. 1, the loss of electrons causes the threshold voltage $V_t$ to drop, causing the threshold voltage distributions of the fifth state P5, the sixth state P6 and the seventh state P7 to move toward the low voltage value direction (indicated by the thick dotted line in FIG. 1). Therefore, a part of the threshold voltage distributions of the memory cells will be lower than the corresponding read voltages Vread1, Vread2 and Vread3, resulting in data read errors, which are referred to as "data retention errors". The part marked "R_err" in FIG. 1 refers to a condition that threshold voltage $V_t$ of the memory cells is lower than the corresponding read voltages Vread1, Vread2 and Vread3. The data retention errors occur at these "R_err" part.

In response to the data retention errors of the memory cells, those skilled in this art provide a data recovery method, in which memory cells are applied with program voltages so that threshold voltage distribution are moved toward a direction of high voltage value (indicated by the thin dotted line in FIG. 1). Furthermore, data recovery methods are improved to achieve better data recovery efficiency.

SUMMARY

According to an aspect of the present disclosure, a data recovery method for a memory device is provided. The memory device comprises a plurality of word lines, a plurality of bit lines and a plurality of memory cells, the memory cells at least comprise a target memory cell, the word lines at least comprise a target word line and an adjacent word line, the adjacent word line is adjacent to the target word line, the target word line is connected to a gate of the target memory cell, the adjacent word line is connected to a gate of an adjacent memory cell, the adjacent memory cell is adjacent to the target memory cell. The data recovery method comprises the following steps. Applying a first program voltage to the target memory cell through the target word line. When applying a first program voltage, concurrently applying a second program voltage to the adjacent memory cell through the adjacent word line.

According to another aspect of the present disclosure, a data recovery method for a memory device is provided. The memory device comprises a plurality of word lines, a plurality of bit lines and a plurality of memory cells, the memory cells at least comprise a first target memory cell and a second target memory cell, the word lines at least comprise a first target word line, a second target word line and an adjacent word line, the adjacent word line is adjacent to the first target word line and the second target word line, the first target word line is connected to a gate of the first target memory cell, the second target word line is connected to a gate of the second target memory cell, the adjacent word line is connected to a gate of an adjacent memory cell, the adjacent memory cell is adjacent to the first target memory cell and the second target memory cell, the first target memory cell is located at a first side of the adjacent memory cell, and the second target memory cell is located at a second side of the adjacent memory cell, and the data recovery method comprises the following steps. Applying a first program voltage to the first target memory cell through the first target word line. When applying a first program voltage, concurrently applying a second program voltage to the adjacent memory cell through the adjacent word line, and applying a third program voltage to the second target memory cell through the second target word line.

Figure 1:
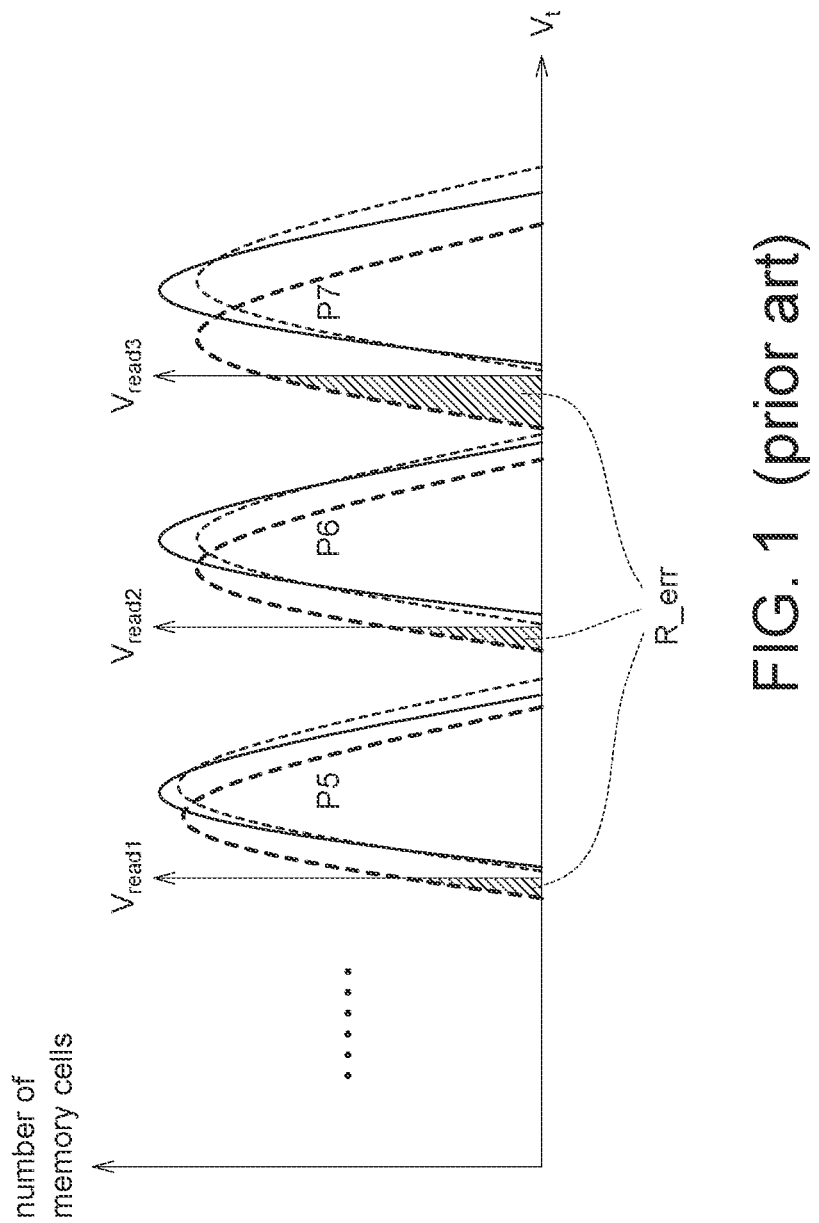
FIG. 1 (prior art) is a schematic diagram illustrating a change of threshold voltage distribution of the memory cells and corresponding memory cells amounts when data retention errors occur and after data recovery is performed.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

Figure 2:
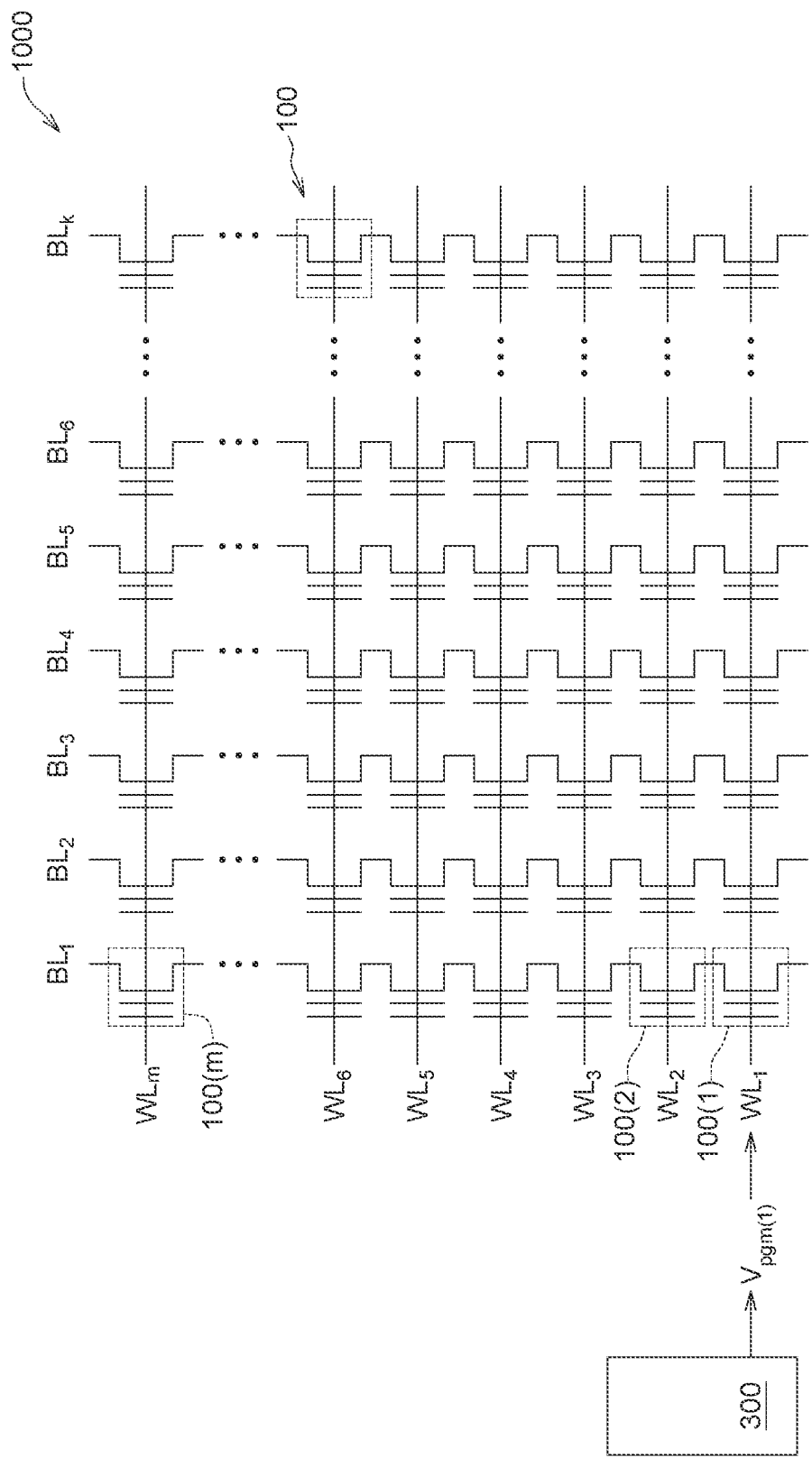
FIG. 2 is a schematic diagram of a memory device according to an embodiment of the disclosure.

FIG. 2 is a schematic diagram of a memory device 1000 according to an embodiment of the disclosure. As shown in FIG. 2, the memory device 1000 includes a plurality of bit lines $BL_1$~$BL_k$, a plurality of word lines $WL_1$~$WL_m$ and a plurality of memory cells 100. The bit lines $BL_1$~$BL_k$ are arranged in vertical rows, the word lines $WL_1$~$WL_m$ are arranged in horizontal columns, and the memory cells 100 are arranged in an array. The gates of the memory cells 100 are correspondingly connected to the word lines $WL_1$~$WL_m$, and the drain electrodes and the source electrodes of the memory cells 100 are correspondingly connected to the bit lines $BL_1$~$BL_k$. The memory cells 100 connected to the same bit line form a NAND memory string, for example, the memory cell 100(1), the memory cell 100(2), the memory cell 100(2), . . . , the memory cell 100(m) form a NAND memory string.

The memory device 1000 further includes a control circuit 300 for controlling the memory device 1000 to perform various operations. When a program operation is performed, the control circuit 300 provides a program voltage and applies the program voltage to the gates of the corresponding memory cells through the word lines $WL_1$~$WL_m$, thereby inducing electrons to accumulate in the memory cells. For example, the control circuit 300 provides a program voltage $V_{pgm(1)}$, and applies the program voltage $V_{pgm(1)}$ to the gate of the memory cell 100(1) through the word line $WL_1$, and the memory cell 100(1) responds to the program voltage $V_{pgm(1)}$ to accumulate electrons, thereby adjusting the threshold voltage of the memory cell 100(1). Accordingly, the memory cell 100(1) stores the corresponding data.

Figure 3:
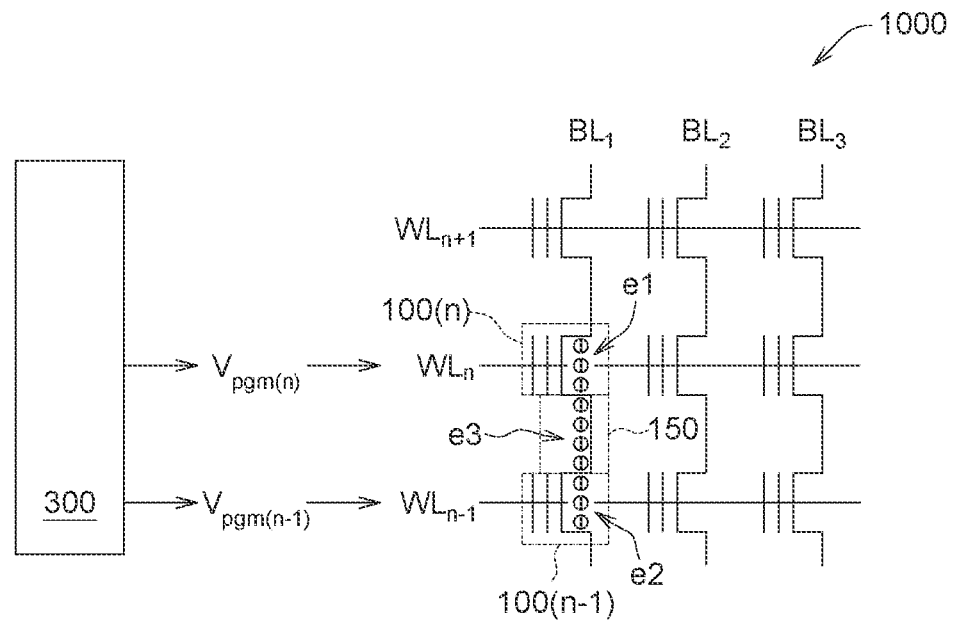
FIG. 3 is a schematic diagram illustrating a data recovery method according to an embodiment of the disclosure which is applied to the memory device of FIG. 2.

FIG. 3 is a schematic diagram illustrating a data recovery method according to an embodiment of the disclosure which is applied to the memory device 1000 of FIG. 2. FIG. 3 shows a part of the memory device 1000, including three bit lines $BL_1$, $BL_2$ and BLs and three word lines WLn-1, $WL_n$ and $WL_{n+1}$ of the memory device 1000. The gates of the memory cells 100(n) on the bit line $BL_1$ are connected to the word line $WL_n$. Another memory cell 100(n-1) on the bit line $BL_1$ is adjacent to the memory cell 100(n), and the gate of the memory cell 100(n-1) is connected to the word line $WL_{n-1}$.

The memory cell 100(n) may be referred to as a "target memory cell", and the data stored in the memory cell 100(n) may be referred to as a "target data". The target data is the target for data recovery. The word line $WL_n$ connected to the memory cell 100(n) may be referred to as a "target word line".

Word line $WL_{n-1}$ on a side of word line $WL_n$ and adjacent to word line $WL_n$ may be referred to as an "adjacent word line". Data recovery is performed according to the word line $WL_n$ and the word line $WL_{n-1}$. The word line $WL_{n-1}$ is connected to the memory cell 100(n-1). Memory cell 100(n-1) is adjacent to the memory cell 100(n) and located on one side of memory cell 100(n). Memory cell 100(n-1) may be referred to as an "adjacent memory cell". The region between the memory cell 100(n) and the memory cell 100(n-1) is referred to as an "inter-cell region" 150.

In the data recovery method of this embodiment, the control circuit 300 simultaneously provides the program voltage $V_{pgm(n)}$ and the program voltage $V_{pgm(n-1)}$. The program voltage $V_{pgm(n)}$ may be referred to as a "first program voltage", and the program voltage $V_{pgm(n-1)}$ may be referred to as a "second program voltage". Under the control of the control circuit 300, the program voltage $V_{pgm(n)}$ is applied to the gate of the memory cell 100(n) through the word line $WL_n$. At the same time, the program voltage $V_{pgm(n-1)}$ is applied to the gate of the memory cell 100(n-1) through the word line WLn-1. That is, the first program voltage is applied to the memory cell 100(n) through the word line WLn, and at the same time, the second program voltage is applied to the memory cell 100(n-1) through the word line WLn-1.

The program voltage $V_{pgm(n)}$ induces electrons e1 (i.e., negative charges) to accumulate in the memory cell 100(n), and the program voltage $V_{pgm(n-1)}$ induces electrons e2 to accumulate in the memory cell 100(n-1). In addition, the program voltage $V_{pgm(n)}$ and the program voltage $V_{pgm(n-1)}$ generate a fringing electric field in the inter-cell region 150, and the fringing electric field induces electrons e3 to accumulate in the inter-cell region 150.

With the data recovery method of this embodiment, the program voltage $V_{pgm(n)}$ is applied to induce electrons e1 to accumulate in the memory cell 100(n) (i.e., re-inject electrons to the memory cell 100(n)), so as to compensate for the loss of electrons from the memory cell 100(n). Moreover, the electrons e3 induced by the fringing electric field in the inter-cell region 150 may facilitate data recovery and has a suppression effect, so as to cause the reading threshold voltages achieve target threshold voltages and suppress the lateral migration of electrons in the memory unit cell 100(n). Thereby, data recovery may be achieved, and loss of electrons from the memory unit cell 100(n) may be mitigated.

Figure 4:
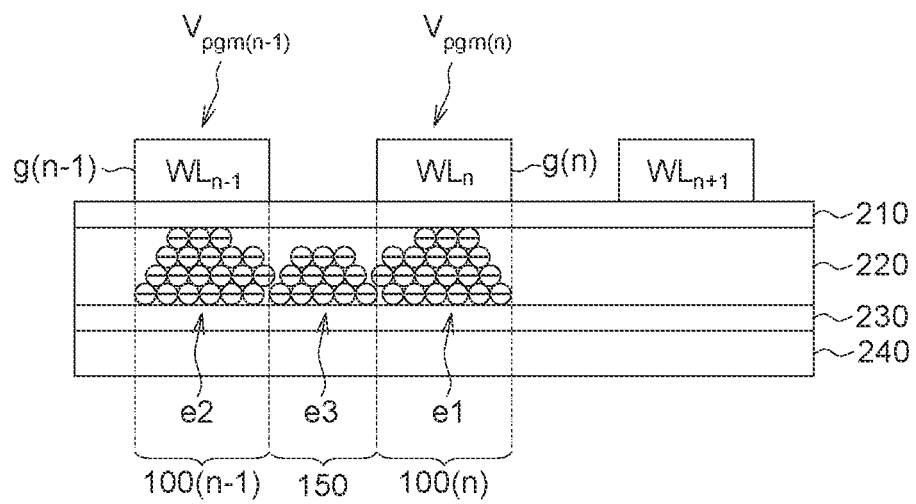
FIG. 4 is a schematic diagram showing the data recovery method of FIG. 3 with the cross-sectional structure of the memory cell and the memory cell.

FIG. 4 is a schematic diagram showing the data recovery method of FIG. 3 with the cross-sectional structure of the memory cell 100(n) and the memory cell 100(n-1). As shown in the cross-sectional structure shown in FIG. 4, the gate g(n-1) of the memory cell 100(n-1) corresponds to the word line $WL_{n-1}$, and the gate g(n) of the memory cell 100(n) corresponds to the word line $WL_n$. The gate g(n-1) and the gate g(n) are disposed above the blocking oxide layer 210, and a charge trap layer 220 is disposed under the blocking oxide layer 210. Furthermore, a tunnel oxide layer 230 is disposed under the charge trap layer 220, and a channel 240 is disposed under the tunnel oxide layer 230.

The program voltage $V_{pgm(n)}$ is applied to the gate g(n) of the memory cell 100(n) through the word line WLn, and the program voltage $V_{pgm(n)}$ induces electrons e1 to accumulate in the charge trapping layer 220 of the memory cell 100(n). At the same time, the program voltage $V_{pgm(n-1)}$ is applied to the gate g(n-1) of the memory cell 100(n-1) through the word line WLn-1, and the program voltage $V_{pgm(n-1)}$ induces electrons e2 to accumulate in the charge trapping layer 220 in the memory cell 100(n-1). Furthermore, the program voltage $V_{pgm(n)}$ and the program voltage $V_{pgm(n-1)}$ generate a fringing electric field in the inter-cell region 150, and the fringing electric field induces electrons e3 to accumulate in the charge trapping layer 220 in the inter-cell region 150.

Figure 5:
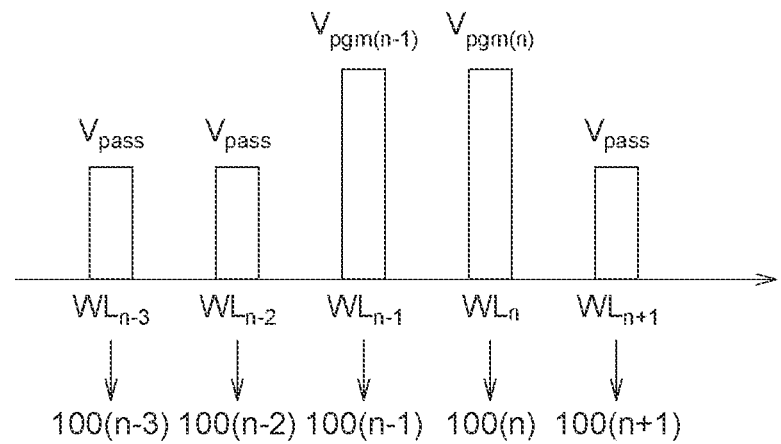
FIG. 5, which is a schematic diagram showing different voltages are applied through each word line in the data recovery method of FIGS. 3 and 4.

Next, please refer to FIG. 5, which is a schematic diagram showing different voltages are applied through each word line in the data recovery method of FIGS. 3 and 4. As shown in FIG. 5, the program voltage $V_{pgm(n-1)}$ and the program voltage $V_{pgm(n)}$ are respectively applied to the memory cell 100(n–1) and the memory cell 100(n) through the word line WLn–1 and the word line WL$_n$. On the other hand, a pass voltage $V_{pass}$ is applied to the gates of memory cells other than the memory cell 100(n–1) and the memory cell 100(n). For example, the pass voltage $V_{pass}$ is applied to the memory cell 100(n–3), the memory cell 100(n–2) and the memory cell 100(n+1) through the word line WLn–3, the word line WLn–2 and the word line WLn+1 respectively. The voltage values of the program voltage $V_{pgm(n-1)}$ and the program voltage $V_{pgm(n)}$ are greater than the pass voltage $V_{pass}$. The above-mentioned program voltage $V_{pgm(n-1)}$, program voltage $V_{pgm(n)}$ and pass voltage $V_{pass}$ are all provided by the control circuit 300 shown in FIGS. 2 and 3.

In the data recovery method of the embodiment shown in FIGS. 3~5, data recovery for the memory cells 100(n) is facilitated by the electrons e3 of the inter-cell region 150, and the lateral migration of the electrons e1 of the memory cell 100(n) is suppressed by the electrons e3 of the inter-cell region 150. After the induced electrons e3 are accumulated in the inter-cell region 150, the electrons e2 of the memory unit cell 100(n–1) are no longer needed. Therefore, an erase operation can be selectively performed to remove the electrons e2 accumulated in the memory cell 100(n–1), so that the memory cell 100(n–1) can be reused. That is, even if the electrons e2 accumulated in the memory cell 100(n–1) are removed, the lateral migration of the electrons in the memory cell 100(n) can still be suppressed by the electrons e3 in the inter-cell region 150.

Figure 6A:
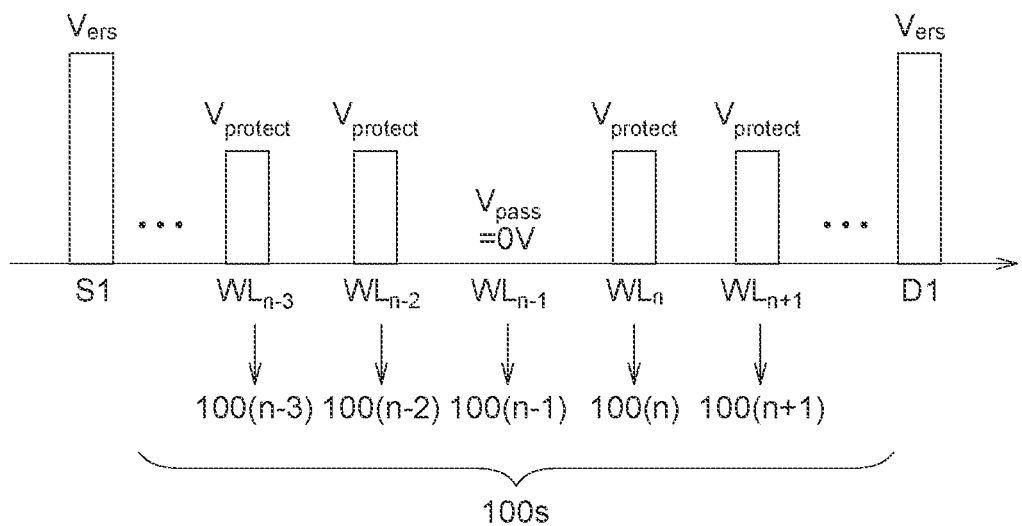
FIGS. 6A-6C are schematic diagrams of performing an erase operation to remove electrons accumulated in the memory cell.
Figure 6B:
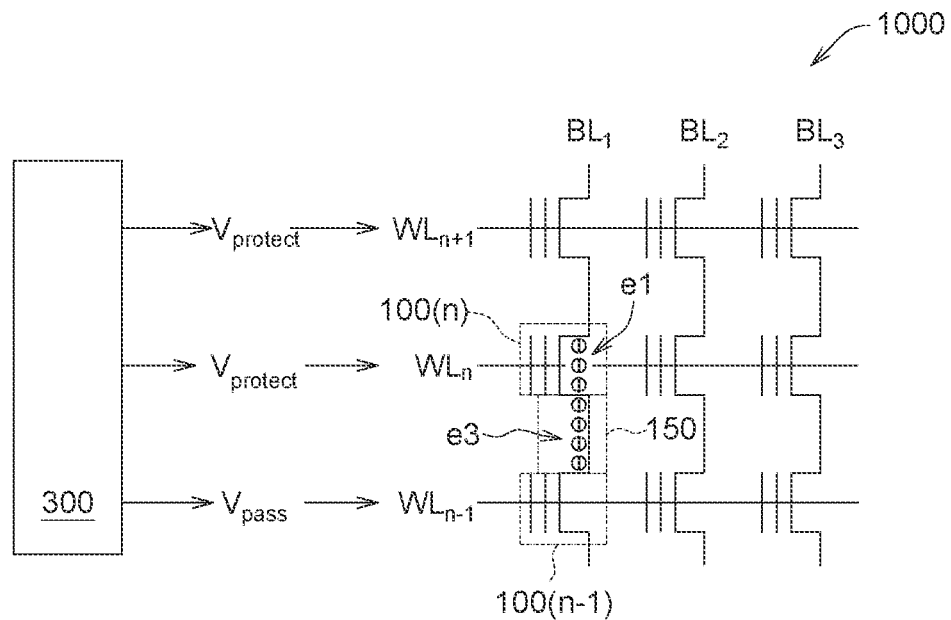
Figure 6C:
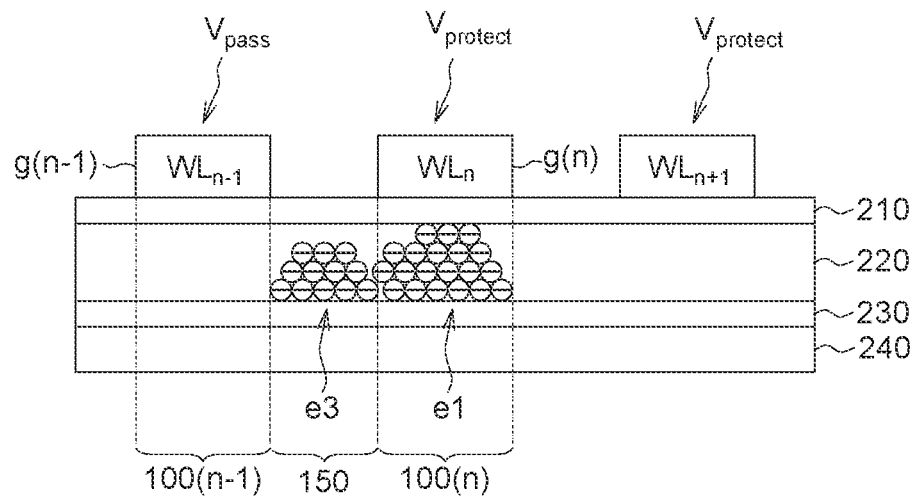

FIGS. 6A-6C are schematic diagrams of performing an erase operation to remove electrons accumulated in the memory cell 100(n–1). Please refer to FIG. 6A first, the memory strings 100s to which the memory cells 100(n–3), 100(n–2), 100(n–1), 100(n), and 100(n+1) belong have a source terminal S1 and drain terminal D1. In the erasing operation, the erasing voltage $V_{ers}$ is applied to the source terminal S1 and the drain terminal D1. In addition, the protection voltage $V_{protect}$ is respectively applied to the word lines WL$_{n-3}$, WL$_{n-2}$, WL$_n$ and WL$_{n+1}$, to maintain the electrons accumulated in the memory cell 100(n) and maintain the original threshold voltage states of the memory cells 100(n–3), 100(n–2) and 100(n+1). The pass voltage $V_{pass}$ is applied to another word line WL$_{n-1}$. Wherein, the voltage value of the erasing voltage $V_{ers}$ is greater than the protection voltage $V_{protect}$. Also, the pass voltage $V_{pass}$ is approximately equal to 0V. The above-mentioned erasing operation can be controlled by the control circuit 300 shown in FIGS. 2 and 3, and the protection voltage $V_{protect}$, the erasing voltage $V_{ers}$ and the pass voltage $V_{pass}$ are provided by the control circuit 300.

Next, referring to FIGS. 6B and 6C, under the effects of the pass voltage $V_{pass}$ provided by the control circuit 300, the electrons accumulated in the memory cell 100(n–1) are removed through an erasing operation. In addition, under the effect of the protection voltage $V_{protect}$ provided by the control circuit 300, the electrons e1 accumulated in the memory cell 100(n) and the electrons e3 accumulated in the inter-cell region 150 can be maintained.

Figure 7A:
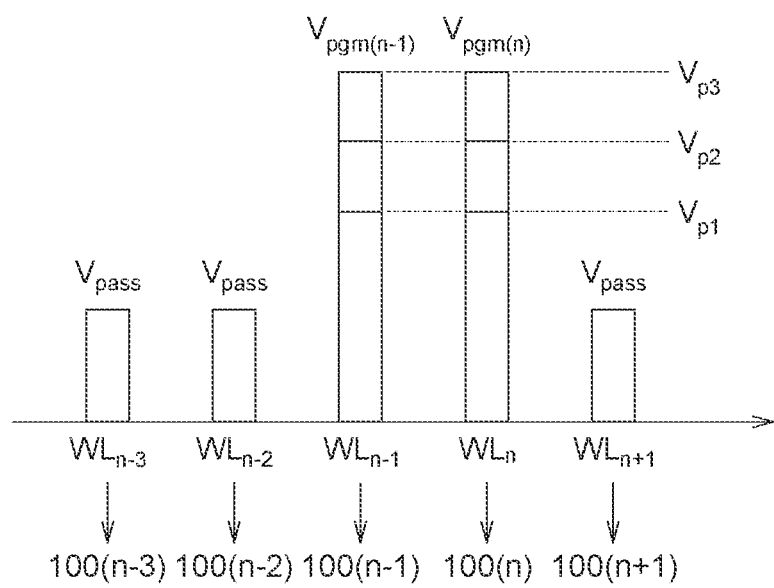
FIG. 7A, which is a schematic diagram of applying different voltages through each word line in a data recovery method according to another embodiment of the disclosure.

On the other hand, please refer to FIG. 7A, which is a schematic diagram of applying different voltages through each word line in a data recovery method according to another embodiment of the disclosure. The embodiment of FIG. 7A is similar to the embodiment of FIG. 5, except that in the embodiment of FIG. 7A. a range of the program voltage $V_{pgm(n)}$ applied to the memory cell 100(n) and a range of the program voltage $V_{pgm(n-1)}$ applied to the memory unit cell 100(n–1) are adjusted according to the threshold voltage state ($V_t$ state) of the memory cell 100(n).

Figure 7B:
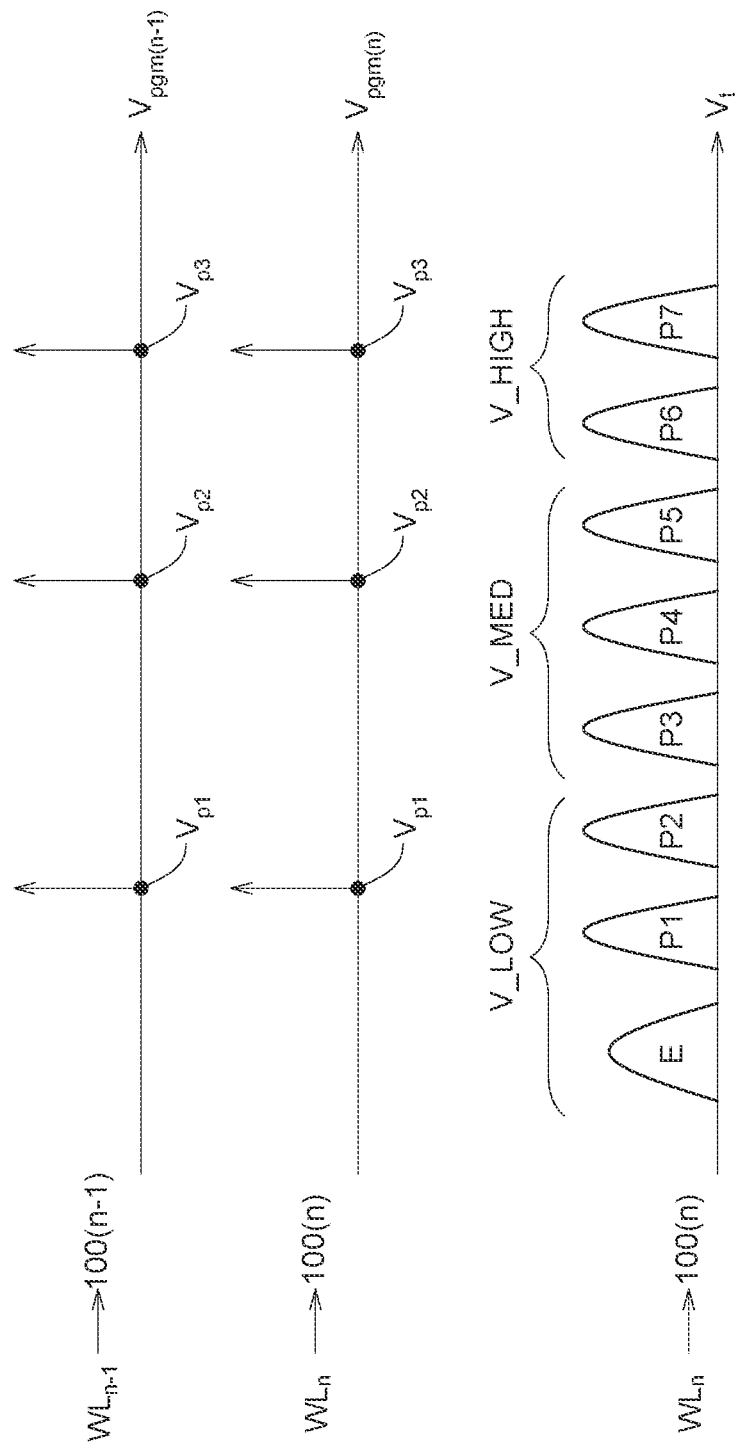
FIG. 7B is a schematic diagram showing the voltage values of the two program voltages applied to two memory cells corresponding to the threshold voltage states of the target memory cells.

FIG. 7B is a schematic diagram showing the voltage values of the program voltages $V_{pgm(n)}$ and $V_{pgm(n-1)}$ applied to the memory cells 100(n) and 100(n–1) corresponding to the threshold voltage states of the memory cells 100(n). Referring to FIGS. 7A and 7B, the memory cell 100(n) corresponding to the word line WL$_n$ is, for example, a triple level memory cell (TLC), and the memory cell 100(n) can store three bits of data that corresponds to eight threshold voltage states. According to the voltage value of the corresponding threshold voltage $V_t$, the eight threshold voltage states, from a low voltage value to a high voltage value, are: the erase state E, the first state P1, the second state P2, the third state P3, the fourth state P4, the fifth state P5, the sixth state P6 and the seventh state P7. The erase state E corresponds to a lower threshold voltage, and the seventh state P7 corresponds to a higher threshold voltage.

In the data recovery method of the present embodiment, voltage region dividing is performed for the above-mentioned eight threshold voltage states of the memory cell 100(n), for example, the erase state E, the first state P1, and the second state P2 are classified as the first voltage region V_LOW, the third state P3, the fourth state P4 and the fifth state P5 are classified as the second voltage region V_MED, and, the sixth state P6 and the seventh state P7 are classified as the third voltage region V_HIGH. That is, the threshold voltage $V_t$ corresponding to the first voltage region V_LOW is smaller than the second voltage region V_MED, and the threshold voltage $V_t$ corresponding to the second voltage region V_MED is smaller than the third voltage region V_HIGH.

A range of The program voltage $V_{pgm(n)}$ applied to the word line WL$_n$ and a range of the program voltage $V_{pgm(n-1)}$ applied to the word line WL$_{n-1}$ are adjusted according to the voltage region dividing of the threshold voltage states of the memory cell 100(n). For example, when the threshold voltage states of the memory cell 100(n) belong to the first voltage region V_LOW, the program voltage $V_{pgm(n)}$ and the program voltage $V_{pgm(n-1)}$ are both adjusted to the first voltage value $V_{p1}$. When the threshold voltage states of the memory cell 100(n) belong to the second voltage region V_MED, the program voltage $V_{pgm(n)}$ and the program voltage $V_{pgm(n-1)}$ are both adjusted to the second voltage value $V_{p2}$. When the threshold voltage states of the memory cell 100(n) belong to the third voltage region V_HIGH, the program voltage $V_{pgm(n)}$ and the program voltage $V_{pgm(n-1)}$ are both adjusted to the third voltage value $V_{p3}$. Wherein, the third voltage value $V_{p3}$ is greater than the second voltage value $V_{p2}$, and the second voltage value $V_{p2}$ is greater than the first voltage value $V_{p1}$. And, the first voltage value $V_{p1}$ is larger than the pass voltage $V_{pass}$. The first voltage value $V_{p1}$, the second voltage value $V_{p2}$ and the third voltage value $V_{p3}$ may be a voltage range, respectively. That is, when the threshold voltage states belong to the first voltage region V_-LOW, the second voltage region V_MED and the third voltage region V_HIGH, the range of the program voltage $V_{pgm(n)}$ and the program voltage $V_{pgm(n-1)}$ are adjusted to a range corresponding to the first voltage value $V_{p1}$, a range corresponding to the second voltage value $V_{p2}$ and a range corresponding to the third voltage value $V_{p3}$.

In another example, the program voltage $V_{pgm(n)}$ applied to the memory cell 100(n) is not equal to the program voltage $V_{pgm(n-1)}$ applied to the memory cell 100(n-1). For example, the voltage value of the program voltage $V_{pgm(n)}$ is slightly greater than or less than the program voltage $V_{pgm(n-1)}$.

The data recovery method of FIGS. 7A and 7B can be controlled by the control circuit 300 of FIGS. 2 and 3. In response to the threshold voltage states of the memory cell 100(n) which belong to the first voltage region V_LOW, the second voltage region V_MED or the third voltage region V_-HIGH, the control circuit 300 adjusts the range of the program voltage $V_{pgm(n)}$ and the range of the program voltage $V_{pgm(n-1)}$ to a corresponding range of the first voltage value $V_{p1}$ and the second voltage value $V_{p2}$ or a corresponding range of the second voltage value $V_{p2}$ and the third voltage value $V_{p3}$.

According to the data recovery method of FIGS. 7A and 7B, when the memory cell 100(n) is in the seventh state P7 (with a higher threshold voltage), the threshold voltage value of memory cells 100(n-1) caused by the program voltage $V_{pgm(n-1)}$ applied to the memory cell 100(n-1) may be smaller than the threshold voltage corresponding to the seventh state P7. On the other hand, when the memory cell 100(n) has a lower threshold voltage, the voltage values of the program voltage $V_{pgm(n)}$ and the program voltage $V_{pgm(n-1)}$ can be lowered. For example, when the memory cell 100(n) is in the first state P1, the second state P2 or the erasing state E, the range of the program voltage $V_{pgm(n)}$ and the program voltage $V_{pgm(n-1)}$ are adjusted to the corresponding range of the first voltage value Vp1. The data recovery methods in FIGS. 7A and 7B are compared with a comparative example in FIG. 8, as will be discussed below in detail.

Figure 8:
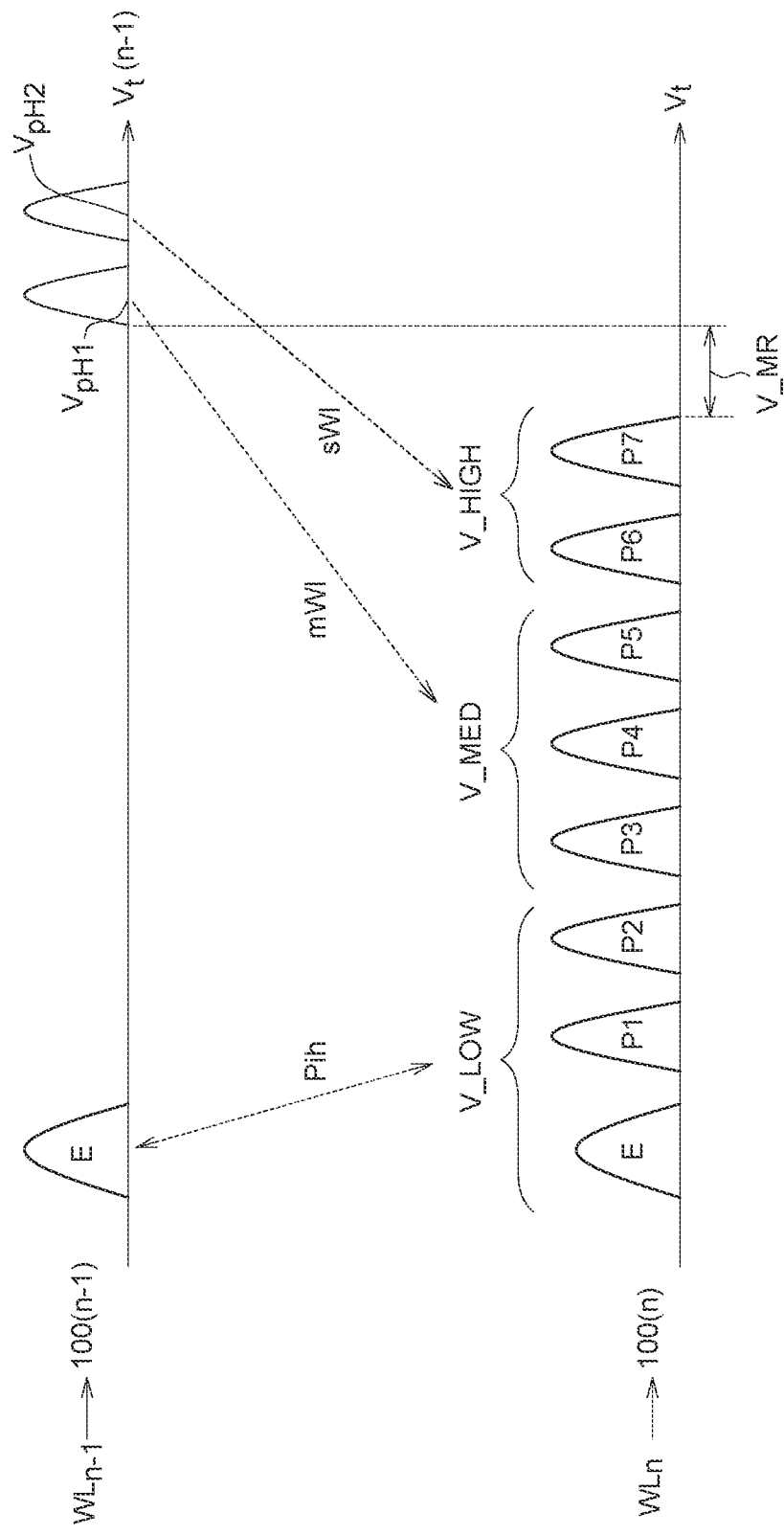
FIG. 8 is a schematic diagram of the threshold voltage of the target memory cells and the threshold voltage of the adjacent memory cells in a data recovery method of a comparative example.

FIG. 8 is a schematic diagram of the threshold voltage of the target memory cells and the threshold voltage of the adjacent memory cells in a data recovery method of a comparative example. In the comparative example of FIG. 8, data recovery is performed by a word-line interference (WI) mechanism. For example, threshold voltage of the memory cell 100(n) may be increased by the word line interference generated by the memory cells 100(n-1) of the adjacent word line $WL_{n-1}$, so that data recovery may be achieved. When the memory cell 100(n) of the word line $WL_n$ belongs to the second voltage region V_MED, the program voltage $V_{pgm(n-1)}$ is applied to the memory cell 100(n-1) through the adjacent word line $WL_{n-1}$ so that threshold voltage $V_t(n-1)$ of memory cell 100(n-1) achieves a threshold voltage value $V_{pH1}$, so as to generate a medium WI effect (may be referred to as "mWI") on the memory cell 100(n). Furthermore, to maintain a strong word line interference effect (may be referred to as "sWI"), the threshold voltage value $V_{PH1}$ of memory cell 100(n-1) must be higher than the threshold voltage $V_t$ corresponding to the seventh state P7 of the memory cell 100(n) and having a sufficient margin V_MR.

When the memory cell 100(n) of the comparative example in FIG. 8 is in the seventh state P7 (with a higher threshold voltage), in order to generate a strong word line interference effect (may be referred to as "sWI") for the memory cell 100(n), the program voltage $V_{pgm(n-1)}$ applied to the memory cell 100(n-1) must be adjusted to a higher voltage range so that threshold voltage $V_t(n-1)$ of memory cell 100(n-1) achieves higher threshold voltage value $V_{pH2}$. In order to maintain strong word line interference effect sWI, the threshold voltage value $V_{PH2}$ of memory cell 100(n-1) must be higher than threshold voltage value $V_{PH1}$ and higher than the threshold voltage $V_t$ corresponding to the seventh state P7 of the memory cell 100(n) and having a sufficient margin V_MR.

On the other hand, in the data recovery method of the present disclosure shown in FIGS. 7A and 7B, the electrons in the inter-cell region 150 are taken to increase threshold voltage of memory cell 100(n) to achieve data recovery, without the need for word line interference mechanism of memory cell 100(n-1). Therefore, in the embodiment of FIGS. 7A and 7B, when the memory cell 100(n) is in the seventh state P7, the range of the program voltage $V_{pgm(n-1)}$ applied to the memory cell 100(n-1) is adjusted a corresponding range of the third voltage value $V_{P3}$, and the threshold voltage $V_t(n-1)$ caused by the program voltage Vpgm(n-1) is slightly lower than the threshold voltage $V_t$ corresponding to the seventh state P7.

In addition, in the comparative example of FIG. 8, when the memory cell 100(n) is in the first state P1, the second state P2 or the erase state E (with a lower threshold voltage), in order to prevent word line interference generated by the memory cell 100(n-1) of the word line $WL_{n-1}$ from excessively affecting the threshold voltage $V_t$ of the memory cell 100(n), the memory cell 100(n-1) of the word line $WL_{n-1}$ is not performed with program operation (i.e., program-inhibited, referred to as "Pih"), for example, the memory cell 100(n-1) is maintained in the erase state E. In contrast, in the data recovery method of the present disclosure shown in FIGS. 7A and 7B, when the memory cell 100(n) is in the first state P1, the second state P2 or the erase state E, the program voltage in a corresponding range of the first voltage value $V_{p1}$ is still applied to memory cell 100(n-1).

Furthermore, in the comparative example of FIG. 8, after the data recovery of the memory cell 100(n) of the word line $WL_n$ is completed, the recovered data of the memory cell 100(n) is read and then written to other memory blocks, for example, write the recovered data of the memory cell 100(n) into a memory cell 100(a) of a word line $WL_a$ in another memory block (not shown in FIG. 8). However, the data retention characteristics of the memory cells 100(a) of another memory block are still affected by the adjacent memory cells 100(a-1). In contrast, in the data recovery method of the present disclosure shown in FIGS. 7A and 7B, after the data recovery of the memory cell 100(n) of the word line $WL_n$ is completed, the recovered data is maintained in the memory cell 100(n) without writing to other memory blocks.

Figure 9A:
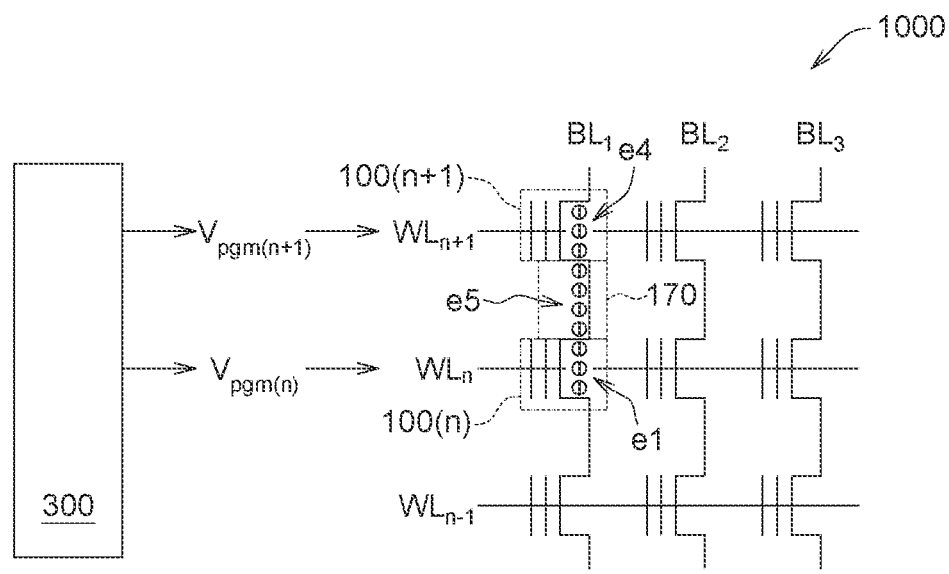
FIGS. 9A to 9C are schematic diagrams illustrating a data recovery method according to still another embodiment.
Figure 9B:
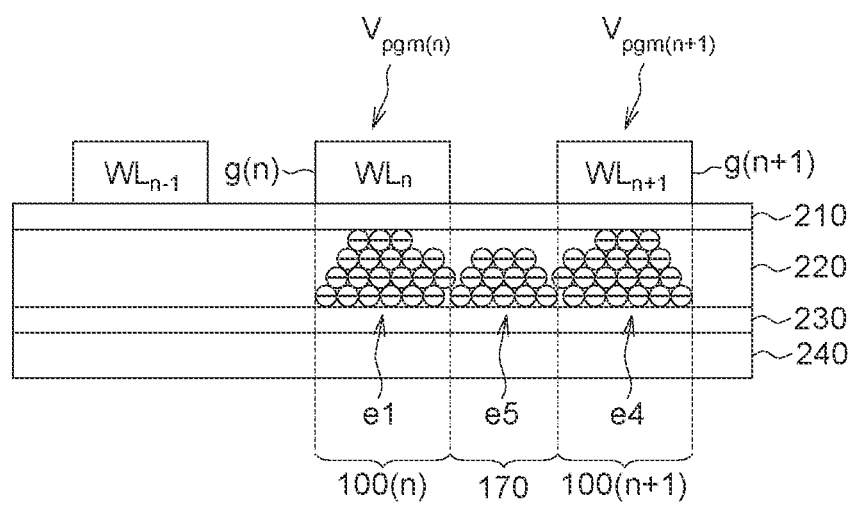
Figure 9C:
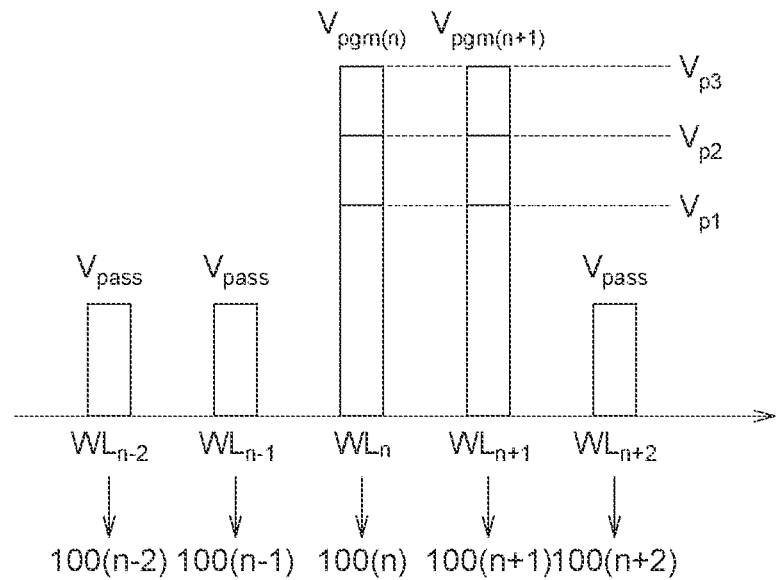

FIGS. 9A to 9C are schematic diagrams illustrating a data recovery method according to still another embodiment. In the embodiment of FIGS. 9A-9C, data recovery is performed according to an adjacent memory cell 100(n+1) on the other side of the memory cell 100(n). The control circuit 300 provides the program voltage $V_{pgm(n)}$ and the program voltage $V_{pgm(n+1)}$ to the word line $WL_n$ and the word line $WL_{n+1}$ respectively. And, the program voltage $V_{pgm(n)}$ is applied to the gate of the memory cell 100(n) through the word line $WL_n$ to induce electrons e1 to accumulate in the memory cell 100(n). At the same time, the program voltage $V_{pgm(n+1)}$ is applied to the gate of the memory cell 100(n+1) through the word line WLn+1 to induce electrons e4 to accumulate in the memory cell 100(n+1).

The program voltage $V_{pgm(n)}$ and the program voltage $V_{pgm(n+1)}$ generate a fringing electric field in the inter-cell region 170 between the memory cell 100(n+1) and the memory cell 100(n), and the fringing electric field induces electrons e5 to accumulate in the inter-cell region 170. The electrons e5 accumulated in the inter-cell region 170 may facilitate to increase threshold voltage of memory cell $100(n)$ to achieve data recovery. After the electrons e5 are accumulated in the inter-cell region 170, the control circuit 300 can selectively perform an erase operation to remove the electrons e4 of the memory cell $100(n+1)$, so that the memory cell $100(n+1)$ can be reused.

Furthermore, the range of the program voltage $V_{pgm(n)}$ and the range of the program voltage $V_{pgm(n+1)}$ applied to the memory cell $100(n)$ and the memory cell $100(n+1)$ are adjusted according to the threshold voltage state of the memory cell $100(n)$. For example, in response to the threshold voltage state of the memory cell $100(n)$ belonging to the first voltage region V_LOW, the second voltage region V_MED or the third voltage region V_HIGH, the control circuit 300 adjusts the range of the program voltage $V_{pgm(n)}$ and the range of the program voltage $V_{pgm(n+1)}$ to the range corresponding to the first voltage value $V_{p1}$ and the second voltage value $V_{p2}$ or the range corresponding to the second voltage value $V_{p2}$ and the third voltage value $V_{p3}$.

Figure 10:
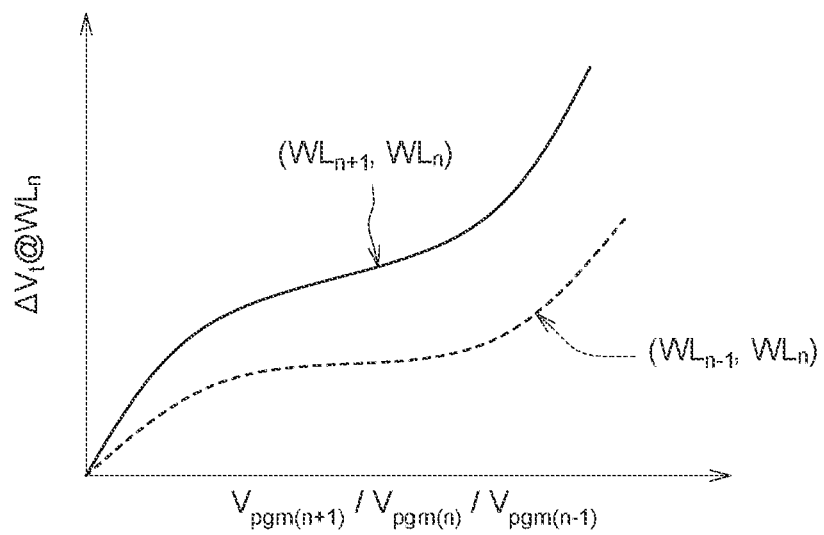
FIG. 10 shows a comparison of effects of the data recovery of the embodiment of FIGS. 9A to 9C with the embodiments of FIGS. 3, 4, 5, 7A, and 7B.

FIG. 10 shows a comparison of effects of the data recovery of the embodiment of FIGS. 9A to 9C with the embodiments of FIGS. 3, 4, 5, 7A, and 7B. The embodiments of FIGS. 3, 4, 5, 7A, and 7B perform data recovery according to word line $WL_n$ and word line $WL_{n-1}$ (word line $WL_{n-1}$ is located on the second side of word line $WL_n$). That is, data recovery is performed for the memory cell $100(n)$ according to the electrons accumulated in the adjacent memory cell $100(n-1)$ on the second side and the inter-cell region 150. The program voltage $V_{pgm(n)}$ and the program voltage $V_{pgm(n-1)}$ are applied to the word line $WL_n$ and the word line $WL_{n-1}$ to induce electrons to accumulate in the memory cell $100(n)$ and the memory cell $100(n-1)$, and the threshold voltage $V_t$ of the memory cell $100(n)$ increases accordingly.

The memory cell $100(n)$ corresponds to the word line $WL_n$, hence the increased value $\Delta V_t$ (i.e., amount of data recovery) of the threshold voltage $V_t$ of the memory cell $100(n)$ is expressed as "$\Delta V_t @ WL_n$", which is marked in the vertical axis of the curve in FIG. 10. In addition, the curve marked "($WL_{n-1}$, $WL_n$)" in FIG. 10 represents the change trend for the increased value $\Delta V_t$ of the threshold voltage $V_t$ of the memory cell $100(n)$ relative to the program voltage $V_{pgm(n-1)}$ and the program voltage $V_{pgm(n)}$. When the curve marked "($WL_{n-1}$, $WL_n$)" has a larger slope, it means that the increased value $\Delta V_t$ has a larger change trend with respect to the program voltage $V_{pgm(n-1)}$ and the program voltage $V_{pgm(n)}$, indicating that the data recovery effect of the memory cell $100(n)$ is better.

On the other hand, the embodiments of FIGS. 9A to 9C perform data recovery according to the program voltage $V_{pgm(n)}$ and the program voltage $V_{pgm(n+1)}$ applied by the word line $WL_n$ and the word line $WL_{n+1}$, wherein the word line $WL_{n+1}$ is located on the first side of the word line $WL_n$. That is, data recovery is performed for the memory cell $100(n)$ according to the electrons accumulated in the adjacent memory cell $100(n+1)$ on the first side and the inter-cell region 170.

The embodiments of FIGS. 9A to 9C correspond to the curve marked "($WL_{n+1}$, $WL_n$)" in FIG. 10, and the embodiments of FIGS. 3, 4, 5, 7A, and 7B correspond to the curve marked "($WL_{n-1}$, $WL_n$)" in FIG. 10. The slope of the curve of "($WL_{n+1}$, $WL_n$)" is greater than the curve of "($WLn-1$, $WLn$)", reflecting that, in the embodiment of FIGS. 9A~9C the increased value $\Delta V_t$ of the threshold voltage $V_t$ of the memory cell $100(n)$ has a larger change trend relative to the program voltage $V_{pgm(n+1)}$ and the program voltage $V_{pgm(n)}$, indicating that data recovery effect for the memory cell $100(n)$ is better.

From the above, the data recovery methods of FIGS. 3, 4, 5, 7A, and 7B are implemented by using the word line $WL_n$ and the word line $WL_{n-1}$ on the second side. The data recovery method of FIGS. 9A to 9C is implemented by the word line $WL_n$ and the word line $WL_{n+1}$ on the first side. The above method are implemented by one side of the word line $WL_n$, which is referred to as "uni-directional" data recovery.

Figure 11A:
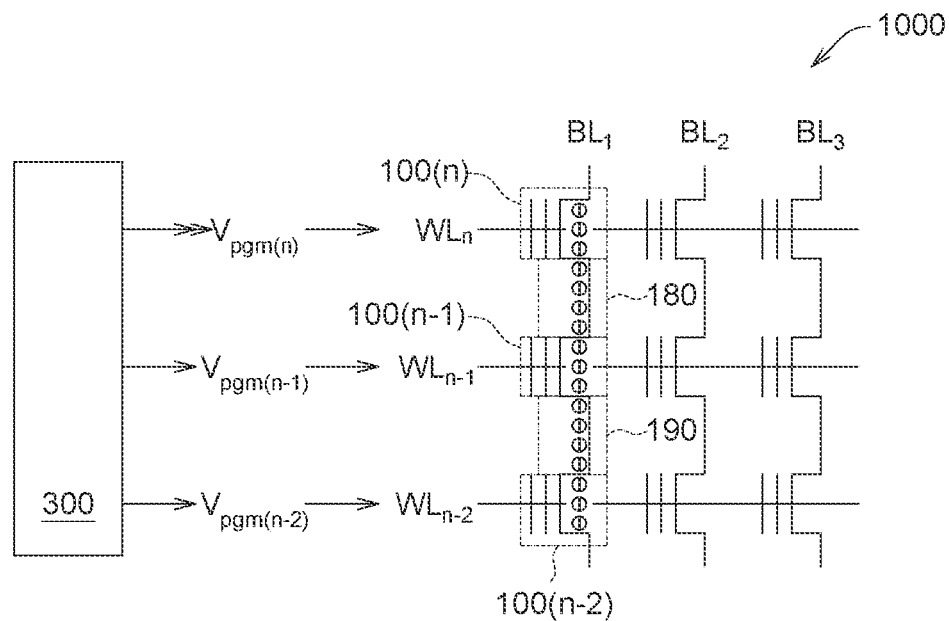
FIGS. 11A-11C are schematic diagrams of a data recovery method according to still another embodiment of the disclosure.
Figure 11B:
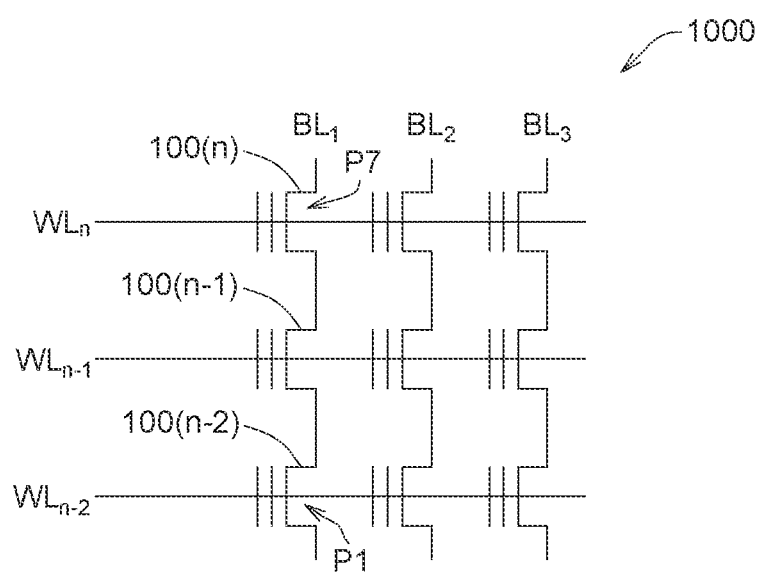
Figure 11C:
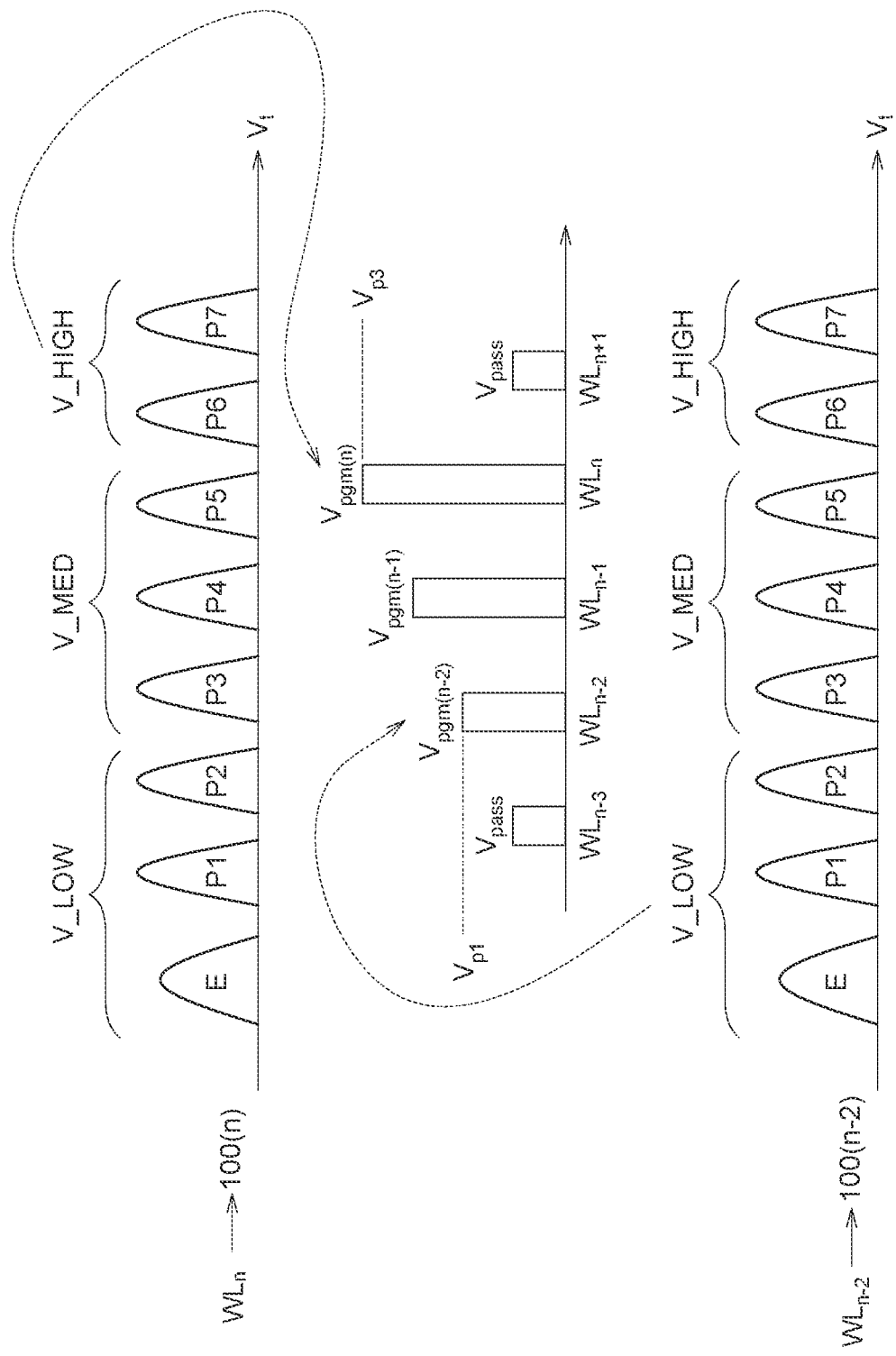

FIGS. 11A~11C are schematic diagrams of a data recovery method according to still another embodiment of the disclosure. In the embodiment shown in FIGS. 11A~11C, the memory cell $100(n)$ and the memory cell $100(n-2)$ both store target data, and the target data is the target for data recovery. The memory cell $100(n)$ may be referred to as a "first target memory cell", and the memory cell $100(n-2)$ may be referred to as a "second target memory cell". The memory cell $100(n)$ is connected to a word line $WL_n$, which may be referred to as a "first target word line". Similarly, the memory cell $100(n-2)$ is connected to the word line $WL_{n-2}$, which is referred to as the "second target word line". A word line $WL_{n-1}$ on one side of word line $WL_n$ and adjacent to the word line $WL_n$ and is referred to as an "adjacent word line". Data recovery is performed according to word line $WL_{n-1}$. Word line $WL_n$ is located on the first side of word line $WL_{n-1}$, and word line $WL_{n-2}$ is located on the second side of word line $WL_{n-1}$. The word line $WL_{n-1}$ is connected to the memory cell $100(n-1)$, and the memory cell $100(n-1)$ is referred to as an "adjacent memory cell". Memory cell $100(n)$ is located on a first side of memory cell $100(n-1)$, and memory cell $100(n-2)$ is located on a second side of memory cell $100(n-1)$.

Taking the word line $WL_{n-1}$ and the memory cell $100(n-1)$ as the reference, data recovery are performed for the memory cells $100(n)$ and $100(n)$ on both sides (i.e., the first side and the second side) at the same time, which is referred to as "bi-directional" data recovery.

More specifically, referring to FIG. 11A first, the control circuit 300 provides program voltages $V_{pgm(n)}$, $V_{pgm(n-1)}$, $V_{pgm(n-2)}$ to the word lines $WL_n$, $WL_{n-1}$, $WL_{n-2}$. In this embodiment, the program voltage $V_{pgm(n)}$ is referred to as a "first program voltage", the program voltage $V_{pgm(n-1)}$ is referred to as a "second program voltage", and the program voltage $V_{pgm(n-2)}$ is referred to as a "third program voltage". That is, the first program voltage is applied to the memory cell $100(n)$ through the word line $WL_n$, and the second program voltage is applied to the memory cell $100(n)$ through the word line $WL_{n-1}$, and the third program voltage is applied to the memory cell $100(n-2)$ through the word line $WL_{n-2}$.

The program voltages $V_{pgm(n)}$, $V_{pgm(n-1)}$ and $V_{pgm(n-2)}$ induce electrons to accumulate in the memory cell $100(n)$, the memory cell $100(n-1)$ and the memory cell $100(n-2)$. Furthermore, a fringing electric field is generated in the inter-cell region 180 between the memory cell $100(n)$ and the memory cell $100(n-1)$ to induce electrons to accumulate in the inter-cell region 180. The electrons in the inter-cell region 180 can cause the data recovery of memory cell $100(n)$ and suppress the lateral migration of electrons in the memory cell $100(n)$.

Similarly, a fringing electric field is generated in the inter-cell region 190 between the memory cell $100(n-1)$ and the memory cell $100(n-2)$ to induce electrons to accumulate in the inter-cell region 190. The electrons in the inter-cell region 190 can cause the data recovery of memory cell $100(n)$ and suppress the lateral migration of electrons in the memory cell $100(n-2)$. The bi-directional data recovery of this embodiment can simultaneously perform data recovery to the memory cells $100(n)$ and $100(n-2)$ corresponding to the word lines $WL_n$ and $WL_{n-2}$ on both sides, so the data recovery efficiency is better than the uni-directional data recovery of the embodiments of FIGS. 3, 4, 5, 7A, 7B and 9A-9C.

Further, in the bi-directional data recovery of FIGS. 11A~11C, the number of electrons induced by the fringing electric fields of the inter-cell region 180 and the inter-cell region 190 depends on the program voltages $V_{pgm(n)}$, $V_{pgm(n-1)}$ and $V_{pgm(n-2)}$ on the word lines $WL_n$, $WL_{n-1}$ and $WL_{n-2}$. In addition, the voltage values of the applied program voltages $V_{pgm(n)}$, $V_{pgm(n-1)}$ and $V_{pgm(n-2)}$ are determined based on the threshold voltages of the memory cell 100(n-2) and the memory cell 100(n). FIG. 11B is a schematic diagram of the threshold voltage states of the memory cells 100(n), 100(n-1) and 100(n-2) of FIG. 11A. Furthermore, FIG. 11C is a schematic diagram showing the program voltage $V_{pgm(n)}$, $V_{pgm(n-1)}$ and $V_{pgm(n-2)}$ of FIG. 11A correspond to the threshold voltage states of the memory cells 100(n) and 100(n-2). Referring to FIGS. 11B and 11C, for the memory cell 100(n) and the memory cell 100(n-2) in the same memory string connected to the bit line $BL_1$, the memory cell 100(n) is in the seventh state P7, which belongs to the third voltage region V_-HIGH and has a higher threshold voltage. Therefore, the range of the program voltage Vpgm(n) applied to the word line $WL_n$ corresponding to the memory cell 100(n) is adjusted to a range corresponding to a third voltage value $V_{p3}$ having a higher voltage value. Moreover, the memory cell 100(n-2) is in the first state P1, which belongs to the first voltage region V_LOW and has a lower threshold voltage. Therefore, the range of the program voltage $V_{pgm(n-2)}$ applied to the word line $WL_{n-2}$ corresponding to the memory cell 100(n-2) is adjusted to a range corresponding to the first voltage value $V_{p1}$ having a lower voltage value.

Since the range of the program voltage $V_{pgm(n)}$ applied through the word line $WL_n$ is adjusted to a range corresponding to the third voltage value $V_{p3}$ of the higher voltage value, the inter-cell region 180 between the memory cell 100(n) and the memory cell 100(n-1) is injected with a larger number of electrons. On the contrary, the range of the program voltage $V_{pgm(n-2)}$ applied to the word line $WL_{n-2}$ is adjusted to a range corresponding to the first voltage value $V_{p1}$ of the lower voltage value, hence the inter-cell region 190 between the memory cell 100(n-2) and the memory cell 100(n-1) is injected with a smaller number of electrons.

In the bi-directional data recovery method of FIGS. 11A-11C, the program voltage $V_{pgm(n-2)}$ applied to the word line $WL_{n-2}$ may be adjusted independently to the program voltage $V_{pgm(n)}$ applied to the word line $WL_n$. That is, the program voltage $V_{pgm(n-2)}$ and the program voltage $V_{pgm(n)}$ may be independently adjusted, so that data recovery for the memory cell 100(n-2) and the memory cell 100(n) of the same memory string may be taken into account concurrently.

Figure 12:
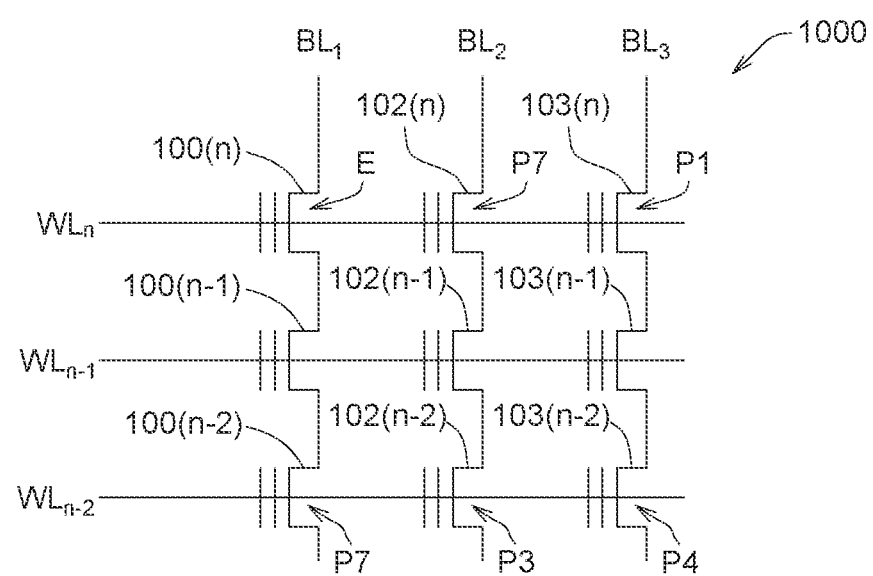
FIG. 12 is a schematic diagram of the threshold voltage states of the memory cells in a comparative example.

On the other hand, FIG. 12 is a schematic diagram of the threshold voltage states of the memory cells in a comparative example. The comparative example of FIG. 12 is based on the word line interference mechanism for bi-directional data recovery. Limited by the threshold voltage states of the memory cell 100(n), the memory cell 100(n-2) on the other side of the same memory string cannot perform data recovery. That is, the comparative example of FIG. 12 cannot independently perform data recovery for the memory cell 100(n-2) and the memory cell 100(n) of the same memory string.

For example, for the memory string corresponding to the bit line $BL_1$, when the memory cell 100(n) is in the erase state E, the memory cell 100(n-1) of the word line $WL_{n-1}$ does not perform program operation (i.e., "program-inhibited"). Therefore, data recovery cannot be performed for the memory cell 100(n-2) on the other side through the memory cell 100(n-1) of the word line $WL_{n-1}$. Similarly, for the memory string corresponding to the bit line $BL_3$, when the memory cell 103(n) is in the first state P1, the memory cell 103(n-1) of the word line $WL_{n-1}$ is not performed with program operation Therefore, data recovery cannot be performed on the memory cell 103(n-2) on the other side through the memory cell 103(n-1). From the above, when the memory cells 100(n), 100(n-2), 102(n), 102(n-2), 103(n) and 103(n-2) of the comparative example in FIG. 12 have random threshold voltage states (i.e., the stored data has a random pattern), it may not be possible to perform data recovery for the memory cells 100(n), 100(n-2), 102(n), 102(n-2), 103(n), 103(n-2) concurrently.

In contrast, in the embodiments of the disclosure shown in FIGS. 11A~11C, the bi-directional data recovery is performed according to the suppression by the electrons accumulated in the inter-cell region. When the first target memory cell or the second target memory cell have threshold voltage states with low threshold voltage, program voltage may be still applied to the adjacent memory cell. Therefore, the embodiments of FIGS. 11A~11C can perform independent data recovery for the memory cells on both sides concurrently. The ability of data error correction is better than the comparative example in FIG. 12. Furthermore, word line interference mechanism for bi-directional data recovery is performed by threshold voltages of memory cells 100(n-1), 102(n-1) and 103(n-1) to achieve data recovery, therefore, amounts of recovered data of memory cells 100(n), 100(n-2), 102(n), 102(n-2), 103(n) and 103(n-2) are limited by threshold voltage of single memory cell 100(n-1), 102(n-1) and 103(n-1). Hence, it is difficult to obtain different recovery effects for memory cells on two sides respectively.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A data recovery method for a memory device, wherein the memory device comprises a plurality of word lines, a plurality of bit lines and a plurality of memory cells, the memory cells at least comprise a target memory cell, the word lines at least comprise a target word line and an adjacent word line, the adjacent word line is adjacent to the target word line, the target word line is connected to a gate of the target memory cell, the adjacent word line is connected to a gate of an adjacent memory cell, the adjacent memory cell is adjacent to the target memory cell, and the data recovery method comprising:
    applying a first program voltage to the target memory cell through the target word line to adjust a threshold voltage of the target memory cell; and
    when applying a first program voltage, concurrently applying a second program voltage to the adjacent memory cell through the adjacent word line to adjust a threshold voltage of the adjacent memory cell.

2. The data recovery method according to claim 1, wherein the second program voltage is equal to the first program voltage.

3. The data recovery method according to claim 1, wherein the threshold voltage of the target memory cell corresponds to a plurality of threshold voltage states, and the data recovery method further comprising:
dividing the threshold voltage states into a plurality of voltage regions; and
adjusting a range of the first program voltage and a range of the second program voltage according to the voltage regions.

4. The data recovery method according to claim 3, wherein the threshold voltage states are divided into a first voltage region, a second voltage region and a third voltage region, and the threshold voltage corresponding to the first voltage region is smaller than the second voltage region, the threshold voltage corresponding to the second voltage region is smaller than the third voltage region, and the data recovery method further comprising:
when the threshold voltage states belong to the first voltage region, adjusting both the first program voltage and the second program voltage to a range corresponding to a first voltage value;
when the threshold voltage states belong to the second voltage region, adjusting both the first program voltage and the second program voltage to a range corresponding to a second voltage value; and
when the threshold voltage states belong to the third voltage region, adjusting both the first program voltage and the second program voltage to a range corresponding to a third voltage value,
wherein, the first voltage value is smaller than the second voltage value, and the second voltage value is smaller than the third voltage value.

5. The data recovery method according to claim 4, wherein the target memory cell is a triple-level memory cell (TLC), and the threshold voltage states of the target memory cell, from a low voltage value to a high voltage value, are: an erase state, a first state, a second state, a third state, a fourth state, a fifth state, a sixth state and a seventh state, the data recovery method further comprising:
classifying the erase state, the first state and the second state into the first voltage region;
classifying the third state, the fourth state and the fifth state into the second voltage region; and
classifying the sixth state and the seventh state into the third voltage region.

6. A data recovery method for a memory device, wherein the memory device comprises a plurality of word lines, a plurality of bit lines and a plurality of memory cells, the memory cells at least comprise a first target memory cell and a second target memory cell, the word lines at least comprise a first target word line, a second target word line and an adjacent word line, the adjacent word line is adjacent to the first target word line and the second target word line, the first target word line is connected to a gate of the first target memory cell, the second target word line is connected to a gate of the second target memory cell, the adjacent word line is connected to a gate of an adjacent memory cell, the adjacent memory cell is adjacent to the first target memory cell and the second target memory cell, the first target memory cell is located at a first side of the adjacent memory cell, and the second target memory cell is located at a second side of the adjacent memory cell, and the data recovery method comprising:
applying a first program voltage to the first target memory cell through the first target word line to adjust a threshold voltage of the first target memory cell; and
when applying a first program voltage, concurrently applying a second program voltage to the adjacent memory cell through the adjacent word line to adjust a threshold voltage of the adjacent memory cell and applying a third program voltage to the second target memory cell through the second target word line to adjust a threshold voltage of the second target memory cell.

7. The data recovery method according to claim 6, wherein the threshold voltage of the first target memory cell and the threshold voltage of the second target memory cell respectively correspond to a plurality of threshold voltage states, and the data recovery method further comprising:
dividing the threshold voltage states into a plurality of voltage regions; and
adjusting a rang of the first program voltage, a rang of the second program voltage and a range of the third program voltage according to the voltage regions.

8. The data recovery method according to claim 7, wherein the threshold voltage states are divided into a first voltage region, a second voltage region and a third voltage region, and the threshold voltage corresponding to the first voltage region is smaller than the second voltage region, the threshold voltage corresponding to the second voltage region is smaller than the third voltage region, and the data recovery method further comprising:
when the threshold voltage states corresponding to the first target memory cell belong to the first voltage region, adjusting the first program voltage to a range corresponding to a first voltage value;
when the threshold voltage states corresponding to the first target memory cell belong to the second voltage region, adjusting the first program voltage to a range corresponding to a second voltage value; and
when the threshold voltage states corresponding to the first target memory cell belong to the third voltage region, adjusting the first program voltage to a range corresponding to a third voltage value,
wherein, the first voltage value is smaller than the second voltage value, and the second voltage value is smaller than the third voltage value.

9. The data recovery method according to claim 8, further comprising:
when the threshold voltage states corresponding to the second target memory cell belong to the first voltage region, adjusting the third program voltage to a range corresponding to a first voltage value;
when the threshold voltage states corresponding to the second target memory cell belong to the second voltage region, adjusting the third program voltage to a range corresponding to a second voltage value; and
when the threshold voltage states corresponding to the second target memory cell belong to the third voltage region, adjusting the third program voltage to a range corresponding to a third voltage value.

10. The data recovery method according to claim 8, wherein each of the first target memory cell and the second target memory cell is a triple-level memory cell (TLC), and the threshold voltage states of the first target memory cell and the second target memory cell, from a low voltage value to a high voltage value, are: an erase state, a first state, a second state, a third state, a fourth state, a fifth state, a sixth state and a seventh state, the data recovery method further comprising:
classifying the erase state, the first state and the second state into the first voltage region;
classifying the third state, the fourth state and the fifth state into the second voltage region; and classifying the sixth state and the seventh state into the third voltage region.

\* \* \* \* \*